United States Patent [19]

Sugai et al.

[11] Patent Number: 4,800,434
[45] Date of Patent: Jan. 24, 1989

[54] POWER SOURCE FOR ELECTRONIC TUNING TUNER

[75] Inventors: Yoshiro Sugai; Hiroyuki Kimura, both of Saitama, Japan

[73] Assignee: Pioneer Electronic Corporation, Tokyo, Japan

[21] Appl. No.: 909,392

[22] Filed: Sep. 19, 1986

[30] Foreign Application Priority Data

Sep. 20, 1985 [JP] Japan .................. 60-144587

[51] Int. Cl.$^4$ .................. H04N 3/18; H04N 5/44
[52] U.S. Cl. .................. 358/190; 358/191.1; 455/343
[58] Field of Search .................. 358/190, 191.1; 455/343, 185, 195

[56] References Cited

U.S. PATENT DOCUMENTS

| | | | |
|---|---|---|---|
| 4,281,349 | 7/1981 | George | 358/191.1 |
| 4,368,409 | 1/1983 | Sivanesan | 358/190 |
| 4,552,166 | 11/1985 | Sutton | 358/190 |
| 4,604,556 | 8/1986 | Haferl | 358/190 |

Primary Examiner—Tommy P. Chin
Attorney, Agent, or Firm—Sughrue, Mion, Zinn, Macpeak, and Seas

[57] ABSTRACT

A power source for an electronically tuned tuner in which a horizontal deflection circuit supplies high voltage power to a fly-back transformer, supplying power to the tuner, when a television signal is received but otherwise a battery source is switched into supplying the tuner. The change-over circuit may be realized by a relay, by transistors or by diodes.

4 Claims, 1 Drawing Sheet

POWER SOURCE FOR ELECTRONIC TUNING TUNER

BACKGROUND OF THE INVENTION

1. Field of the Invention

The present invention relates to a power source for an electronically tuned tuner for receiving television signals and other broadcast signals.

2. Description of the Prior Art

FIG. 4 shows an example of a conventionally known power source which comprises a horizontal deflection circuit 1, a fly-back transformer 2, a tuning voltage generating circuit 3, an electronic tuning front end 4, a resistor 5, and a Zener diode 6.

When television signals are received by the electronic front end 4, it is necessary to provide a relatively high power source voltage of about 30 volts in order to produce a tuning voltage $V_T$ because the frequency band of UHF is wide, namely, 470–770 MHz. In a television receiver in which AC is used as a power source, the power source voltage can be easily obtained. In a television receiver in which a DC power source is used, on the contrary, there is provided, generally, only a DC power source of 12 volts, 9 volts, or the like. Therefore, for example as shown in FIG. 4, a power source voltage of about 40 volts is formed by the fly-back transformer 2 and this voltage is stabilized by the Zener diode 6 so as to be used as a source voltage.

However, since the source voltage is always supplied to the tuning voltage generating circuit 3, it is required to operate the horizontal deflection circuit 1 to obtain the source voltage from the fly-back transformer 2 even in the case of reception of FM broadcasting or medium wave broadcasting signals where only a low tuning voltage is required. This results in a disadvantageous consumption of power and in shortened life of parts because a large amount of power is handled in the horizontal deflection circuit 1. This further results in generation of noise because high harmonic waves exert influence over AM broadcasting band. Further, when other than television signals are received, the synchronizing signals disappear and therefore there is a possibility of lowered voltage from the fly-back transformer 2 or of generation of abnormally high voltage in the case that the horizontal AFC frequency is shifted due to time aging or any other reason. Accordingly, it has been considered to separately provide a dedicated DC-DC converter. Although such a dedicated DC-DC converter makes it possible in fact to stop the horizontal deflection circuit 1 in the case other than reception of television signals, there are unavoidable disadvantages in view of cost and space for mounting the converter.

SUMMARY OF THE INVENTION

It is therefore an object of the present invention to overcome the above-mentioned disadvantages in the prior art.

It is another object of the present invention to provide a power source for an electronic tuning tuner, in which a source voltage necessary for tuning can be reliably obtained in the situation that the horizontal deflection circuit is stopped when a television signal is not received without bringing about any disadvantage such as high cost, etc.

It is a further object of the present invention to provide a power source for an electronically tuned tuner, in which a source voltage necessary for a tuning voltage generating circuit can be reliably obtained by using a voltage source from a fly-back transformer in the case of reception of television signals and by using another low voltage source in the case other than the reception of television signals.

To attain the above objects, according to an aspect of the present invention, the power source for an electronically tuned tuner comprises an electronic tuning front end, a tuning voltage generating circuit, a horizontal deflection circuit, a fly-back transformer, and a power source change-over circuit connected between the fly-back transformer and the tuning voltage generating circuit. The change-over circuit is arranged to operate such that a source voltage is applied to the tuning voltage generating circuit from the fly-back transformer when television signals are received and from a DC power source of a voltage lower than an output voltage of the fly-back transformer in the case other than the reception of television signals.

These and other objects, features and advantages of the invention will become more apparent upon a reading of the following detailed description and drawings.

DESCRIPTION OF THE PREFERRED EMBODIMENTS

Figure 1:
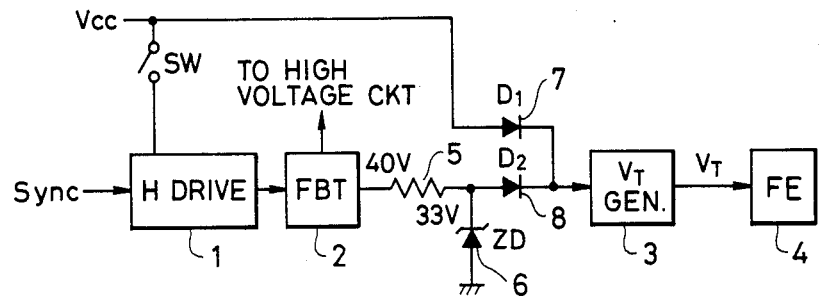
FIG. 1 is a circuit block diagram showing an embodiment of the present invention.
Figure 2:
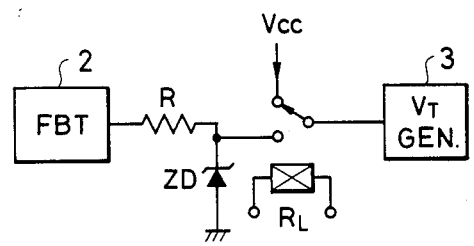
FIG. 2 is a circuit block diagram showing a main part of another embodiment of the present invention.
Figure 3:
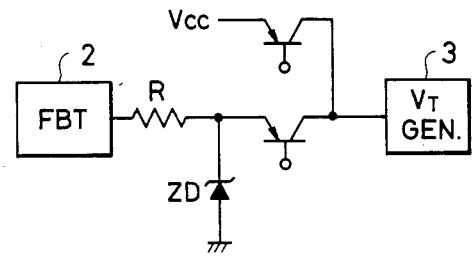
FIG. 3 is a circuit block diagram showing a main part of still another embodiment of the present invention.

Referring to FIGS. 1 through 3, three preferred embodiments of the present invention will be described hereunder.

Figure 4:
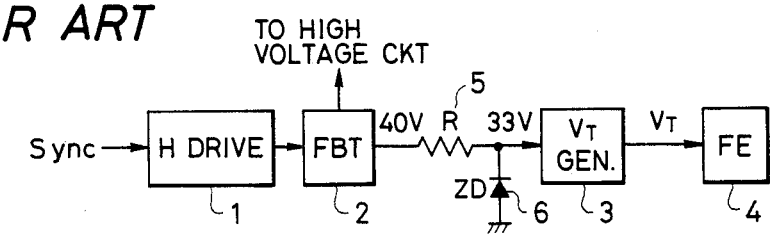
FIG. 4 is a circuit block diagram showing an example of the prior art.

In FIG. 1, the reference numerals 1 through 6 are used to designate the same parts as those in the prior art of FIG. 4 and therefore explanation about those parts are omitted here. Additionally, diodes 7 and 8 are arranged to form a change-over circuit. The upper diode 7 is connected between a low voltage power source ($V_{cc}$) such as a battery and a junction between the fly-back transformer 2 and the tuning voltage generating circuit 3, while the lower diode 8 is connected between the tuning voltage generating circuit 3 and a junction between the resistor 5 and the Zener diode 6.

When television signals are received, the horizontal deflection circuit 1 is operated by a switch SW, so that a source voltage higher than $V_{cc}$ can be obtained from the fly-back transformer 2. As a result the lower diode 8 is turned on and the upper diode 7 is turned off and a voltage of about 30 volts is supplied to the tuning voltage generating circuit 3.

In the case other than reception of television signals, the switch SW is turned off so that the output of the fly-back transformer 2 is zero. As a result, the lower diode 8 is turned off and the upper diode 7 is turned on and a lower voltage ($V_{cc}$) from the battery is supplied to the tuning voltage generating circuit 3. In this case, it is possible to design the maximum value of the voltage $V_T$ to be, for example, about 8 volts, and therefore the source voltage of 9 volts from the battery is sufficient for the operation of the tuning voltage generating circuit 3.

Although the Zener diode 6 is connected between the resistor 5 and the lower diode 8 in the embodiment of FIG. 1, it may be interposed between the diode 8 and the tuning voltage generating circuit 3. Further, the lower diode 8 may be used also as a rectifying diode in the periphery of the fly-back transformer 2. Yet further, if a Zener diode is used as the upper diode 7 (assuming that $V_{cc}=9$ volts, a 24-volt Zener diode is used) the upper diode 7 may be used also as the Zener diode 6, so that it is possible reduce the number of parts.

In place of using such diodes 7 and 8 as in the first embodiment of FIG. 4, the change-over circuit may be constructed of a relay circuit, as shown in a second embodiment of FIG. 2. Alternatively, the change-over circuit may be constructed by such an alternatively activated two-transistor circuit as shown in a third embodiment of FIG. 3. The voltage drop caused in the change-over circuit in these embodiments is smaller than that in the first embodiment using the diodes, and therefore the second and third embodiments are advantageous in the case where the source voltage from the battery is low.

As described above, according to the present invention, the tuning voltage generating circuit is supplied with a high source voltage obtained from the fly-back circuit in the case of reception of television signals but is supplied with a low source voltage obtained from the battery or the like in the case of other than the reception of television signals. Therefore, it is possible to reliably obtain the source voltage necessary for generation of tuning voltage. Further, since the horizontal deflection circuit is stopped in the case other than reception of television signals, there are advantages in reduction of power consumption, in prolongation of part life, and in suppression of noise which may otherwise be caused by high harmonic waves derived from the high source voltage. Furthermore, one or two diodes will be enough as additional parts to realize the present invention. Thus, the additional cost is very low and no special consideration is required for providing a mounting space of the additional parts.

We claim:

1. A power source for an electronically tuned tuner, comprising:
   an electronic tuning front end;
   a tuning voltage generating circuit for supplying a tuning voltage to said front end;
   a horizontal deflection circuit;
   a fly-back transformer receiving a voltage signal from said horizontal deflection circuit;
   a DC power source of a voltage lower than an output voltage of said fly-back transformer; and
   power source change-over circuit means connected between both an output of said fly-back transformer and an output of said DC power source and an input to said tuning voltage generating circuit, said change-over circuit means for applying a source voltage from said fly-back transformer to said tuning voltage generating circuit in a case of reception of television signals, and for applying a source voltage from said DC power source in a case other than reception of television signals, wherein said change-over circuit comprises a first diode connected between said input of said tuning voltage generating circuit and said output of said fly-back transformer and a second diode connected between said input of said tuning voltage generating circuit and said output of said DC power source.

2. A power source as recited in claim 1, wherein said change-over circuit further comprises a power switch for said horizontal deflection circuit.

3. A power source for an electronically tuned tuner, comprising:
   an electronic tuning front end;
   a tuning voltage generating circuit for supplying a tuning voltage to said front end;
   a horizontal deflection circuit;
   a fly-back transformer receiving a voltage signal from said horizontal deflection circuit;
   a DC power source of a voltage lower than an output voltage of said fly-back transformer; and
   power source change-over circuit means connected between both an output of said fly-back transformer and an output of said DC power source and an input to said tuning voltage generating circuit, said change-over circuit means for applying a source voltage from said fly-back transformer to said tuning voltage generating circuit in a case of reception of television signals, and for applying a source voltage from said DC power source in a case other than reception of television signals, wherein said change-over circuit comprises a relay having an output connected to said input of said tuning voltage generating circuit and an input switchable between said output of said DC power source and said output of said fly-back transformer.

4. A power source for an electronically tuned tuner, comprising:
   an electronic tuning front end;
   a tuning voltage generating circuit for supplying a tuning voltage to said front end;
   a horizontal deflection circuit;
   a fly-back transformer receiving a voltage signal from said horizontal deflection circuit;
   a DC power source of a voltage lower than an output voltage of said fly-back transformer; and
   power source change-over circuit means connected between both an output of said fly-back transformer and an output of said DC power source and an input to said tuning voltage generating circuit, said change-over circuit means for applying a source voltage from said fly-back transformer to said tuning voltage generating circuit in a case of reception of television signals, and for applying a source voltage from said DC power source in a case other than reception of television signals, wherein said change-over circuit comprises a first transistor connected between said input of said tuning voltage generating circuit and said output of said fly-back transformer and a second transistor connected between said input of said voltage tuning generating circuit and said output of said DC power source.

* * * * *